(12) United States Patent
Blomqvist et al.

(10) Patent No.: US 10,190,938 B2
(45) Date of Patent: Jan. 29, 2019

(54) SEMI-FLEXIBLE PROOF-MASS

(71) Applicant: MURATA MANUFACTURING CO., LTD., Nagaokakyo-shi, Kyoto (JP)

(72) Inventors: Anssi Blomqvist, Helsinki (FI);
Ville-Pekka Rytkönen, Klaukkala (FI);
Matii Liukku, Helsinki (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 116 days.

(21) Appl. No.: 15/262,156

(22) Filed: Sep. 12, 2016

(65) Prior Publication Data
US 2017/0082519 A1    Mar. 23, 2017

(30) Foreign Application Priority Data

Sep. 22, 2015   (FI) ...................................... 20155677

(51) Int. Cl.
*G01M 7/08*      (2006.01)
*B81B 3/00*      (2006.01)
(Continued)

(52) U.S. Cl.
CPC .............. *G01M 7/08* (2013.01); *B81B 3/001* (2013.01); *B81B 3/0013* (2013.01);
(Continued)

(58) Field of Classification Search
CPC ...... G01M 7/08; G01M 17/0078; G01N 3/30; G01L 5/0052; A42B 3/046
(Continued)

(56) References Cited

U.S. PATENT DOCUMENTS 6,067,858 A  *  5/2000  Clark ................. G01C 19/5719
                                                    73/504.16
7,514,283 B2 *  4/2009  Partridge ............ B81C 1/00293
                                                       438/48
(Continued)

FOREIGN PATENT DOCUMENTS

TW       200944466 A      11/2009
TW       201000390 A       1/2010
(Continued)

OTHER PUBLICATIONS

Finnish Search Report dated May 12, 2016 corresponding to Finnish Patent Application No. 20155677.
(Continued)

*Primary Examiner* — Eric S McCall
*Assistant Examiner* — Mohammed E Keramet-Amircola
(74) *Attorney, Agent, or Firm* — Squire Patton Boggs (US) LLP

(57) ABSTRACT

A microelectromechanical device includes a semi-flexible proof-mass comprising a primary part, a secondary part and a stiff spring suspending the primary part and the secondary part. The spring causes the parts to move as a single entity when the device is in its normal range. A first stopper structure stops the primary part. The proof-mass is configured to deform through deflection of the spring, when the device is subjected to a shock having a force that is beyond the normal operation range. While the shock causes motion of the proof-mass in one direction along an axis of movement, the spring is configured to cause a restoring force causing the secondary part of the proof-mass to be driven into a restoring motion in a direction opposite to motion along an axis caused by the shock. Momentum of the secondary part causes the primary part to dislodge from the first stopper structure.

16 Claims, 10 Drawing Sheets

(51) Int. Cl.
*B81B 7/00* (2006.01)
*B81C 1/00* (2006.01)
*G01P 15/08* (2006.01)
*G01P 15/125* (2006.01)

(52) U.S. Cl.
CPC ........ *B81B 7/0016* (2013.01); *B81C 1/00968* (2013.01); *G01P 15/0802* (2013.01); *G01P 15/125* (2013.01); *B81B 2201/0235* (2013.01); *G01P 2015/0874* (2013.01)

(58) Field of Classification Search
USPC ....................................................... 73/12.01
See application file for complete search history.

(56) References Cited

U.S. PATENT DOCUMENTS

| | | | | |
|---|---|---|---|---|
| 7,640,805 | B2* | 1/2010 | Diamond | B81C 1/00246 |
| | | | | 73/514.32 |
| 9,097,524 | B2* | 8/2015 | Seeger | G01C 19/5733 |
| 2007/0193355 | A1* | 8/2007 | Axelrod | G01P 15/125 |
| | | | | 73/514.32 |
| 2008/0282802 | A1 | 11/2008 | Pike et al. | |
| 2009/0256297 | A1* | 10/2009 | Geisberger | G01P 15/125 |
| | | | | 267/160 |
| 2010/0313657 | A1 | 12/2010 | Trusov et al. | |
| 2012/0148448 | A1 | 6/2012 | Kulah et al. | |
| 2012/0216616 | A1 | 8/2012 | Schultz | |
| 2012/0280591 | A1* | 11/2012 | Schultz | B81B 3/0016 |
| | | | | 310/300 |
| 2013/0167635 | A1* | 7/2013 | Su | G01C 19/5747 |
| | | | | 73/504.12 |
| 2014/0260613 | A1* | 9/2014 | Qiu | G01C 19/5733 |
| | | | | 73/504.15 |
| 2015/0033849 | A1* | 2/2015 | Hanson | G01C 19/5783 |
| | | | | 73/504.12 |
| 2015/0068308 | A1 | 3/2015 | Blomqvist et al. | |

FOREIGN PATENT DOCUMENTS

TW          201326750 A      7/2013
WO     WO 2014/207710 A1   12/2014

OTHER PUBLICATIONS

Taiwanese Search Report Application No. 105129586 dated Jul. 17, 2017.

International Search Report international application No. PCT/IB2016/001352 dated Dec. 5, 2016.

* cited by examiner

SEMI-FLEXIBLE PROOF-MASS

BACKGROUND

Field

The present invention relates to a micromechanical device.

Description of the Related Art

Micro-Electro-Mechanical Systems, or MEMS, can be defined as miniaturized mechanical and electro-mechanical systems where at least some elements have a mechanical functionality. Since MEMS devices are created with the same or similar tools used to create integrated circuits, micromachines and microelectronics can even be fabricated on the same piece of silicon. MEMS structures can be applied to quickly and accurately detect very small changes in physical properties.

While being very small in size, MEMS structures have different and unique failure mechanisms when compared to similar macroscopic structures.

One failure mechanism known for MEMS devices is stiction, which means adhesion of structural components to one another or to a substrate, material from which the structure is made of. Stiction may be prevented for instance by using anti-stiction coatings or forming surface structures such as for example bumps at the colliding surfaces so that touching surface area is reduced.

Another known failure mechanism is breakage, such as cracking or fracture of MEMS structures due to impact. A single, hard impact may cause cracking or fracture of a MEMS structure, or several repeated impacts may cause fatigue of MEMS structure which eventually leads to breaking of the structure.

US2012/0280591 presents a MEMS device with movable element having a secondary structure having a secondary mass and a spring interconnected with the secondary mass and the movable element. When the device is subject to mechanical shock, the secondary structure causes the secondary mass to impact the movable element so that it's likely dislodged if stuck after the impact. A problem relating to the prior art US2012/0280591 is that although the secondary structure enables relief from sticking problem, the movable mass may be damaged due to the impact caused by a shock.

US201426013 presents an elastic bump for reducing impact force caused to the MEMS moving structure upon encountering a shock, thus reducing risk of structure breakage. Secondary, non-flexible bump stops are implemented in the proof-mass.

What is needed is an improved structure for a MEMS device that can both reduce risk of structure cracking and have a mechanism to prevent sticking of the movable proof-mass.

SUMMARY

An object of the present invention is to provide a device and method so as to overcome the prior art disadvantages.

Term "plane of the device" refers to the plane formed by the movable parts of the MEMS device, when they are not excited or deflected by any external force. A linear axis of movement may reside within said plane of the device, or it may be an axis that is essentially orthogonal to the plane of the device.

The present invention is based on the idea of changing the form of the proof-mass, which enables both reduced impact forces for reducing risk of structure cracking due to impact, and reduced risk of proof-mass sticking. The proof-mass is divided into at least two parts, which are mutually connected by stiff springs. Term stiff spring refers to a spring that has a high spring factor, so that the spring essentially deflects only when subject to a relatively strong force. The proof-mass thus becomes a semi-flexible structure, which moves as a single mass in normal operating conditions of the MEMS device. Primary part(s) of the proof-mass may hit stopper structure(s) due to a shock, while secondary part(s) of the proof-mass is (are) suspended by the stiff springs and therefore either prevented or made less likely to hit any stopper structures. Term primary part(s) refers here to one or more parts of the proof-mass which are configured to take the first impact by hitting a stopper structure. The proof-mass structure may have one or more of such primary parts. The secondary part forms preferably a major part of the mass of the semi-flexible proof-mass, where term major part may indicate a share of at least 20% or more up to even more than 50% of the entire mass of the proof-mass. Secondary part(s) may be configured to hit second stopper structures after the primary part(s), but the secondary part(s) may also be configured to be stopped by coming into contact with other parts of the proof-mass or with springs coupling the parts. Suspension between the primary and secondary parts of the proof-mass is flexible, as opposite to a rigid structure, but stiff enough that during normal operating conditions, the at least two parts of the semi-flexible proof-mass move as a single, rigid proof-mass. Rigid refers here to a structure that does not substantially deform, and semi-flexible refers to a structure that does not deform in normal operating conditions. In other words, rigid suspension spring(s) a.k.a. coupling spring(s) or simply just as the rigid springs between the at least two parts of the semi-flexible proof-mass has/have high spring constant. When subject to a shock beyond normal operating conditions, this suspension between the primary and secondary parts acts as a spring, allowing the at least two parts of the semi-flexible proof-mass to move with respect to each other. Normal operating conditions may be defined as conditions in which movement of the proof-mass does not cause contact of first parts of the proof-mass with second parts of the proof-mass or with other parts of the device residing within the same plane with the proof-mass, such as anchors, stoppers, frames, detection structures like combs or comb fingers and so on. In normal operating conditions, the proof-mass and detection structures attached to the proof-mass are thus enabled to move in the intended direction, providing a detection signal that changes according to the position or speed of movement of the proof-mass. In addition to reducing instantaneous forces caused by the shock to the proof-mass and thus reducing risk of breakage, the semi-flexible suspension between the primary and secondary parts by the stiff spring(s) causes a restoring force. This restoring force causes a significant part of the semi-flexible proof-mass, i.e. at least the secondary part of the semi-flexible proof-mass, to bounce back and gain momentum, which improves capability of the entire structure to dislodge from contact with stopper structures and facilitates return of the proof-mass in its normal operating position.

Term "main spring(s)" refer to springs coupling the semi-flexible proof-mass to at least one suspension structure such as an anchor. Main springs are configured to be flexible at least in the intended direction of movement of the semi-flexible proof-mass. Main springs may further contribute to the dislodging capability by further adding the total releasing force. Main springs have a lower spring coefficient in the intended direction of movement (a.k.a. axis of movement) of the semi-flexible proof-mass than the stiff springs.

Main spring(s) and stiff springs are configured to allow movement of the semi-flexible proof-mass and relative movement of the primary and secondary parts of it respectively along the same axis of movement, which is aligned with the intended direction of motion of the semi-flexible proof-mass. In other words, the movement of the semi-flexible proof-mass is intended to occur along an axis of movement, enabled by the main spring(s), and the stiff springs are configured to allow movement along (in the direction of) the same axis of movement.

Coupling the semi-flexible proof-mass towards suspension structures such as anchors with main springs attached to the secondary part(s), is especially beneficial in case of sticking and for preventing sticking. Term sticking indicates a known problem of microelectromechanical structures, where two surfaces of the structure coming into contact with each other may stick together. By suspending the semi-flexible proof-mass from the secondary part(s), when both the primary and secondary parts have come to a contact with a stopper structure, all restoring forces caused by the main spring(s) and the stiff spring(s) act towards dislodging the secondary part(s) from the contact. Thus, the configuration effectively prevents sticking. The restoring force caused by the main spring(s) sums with the restoring force caused by the stiff spring(s), and the total restoring force acts to dislodge the secondary part. Furthermore the momentum of the moving secondary part helps to dislodge the primary part and return the device into its normal operation position. The semi-flexible proof-mass is preferably formed as a substantially planar structure, situated in a plane. Structural parts of the semi-flexible proof-mass are preferably situated in a common plane, which may comprise the plane of the device. For example, a semi-flexible proof-mass capable to deflect along at least one axis of movement within the plane of the device may comprise a structure etched from an essentially planar, homogenous silicon material layer having a non-zero thickness. Thus, the manufacturing process is relatively simple, which increases manufacturing process gain and facilitates uniform performance of the multiple devices created on the same silicon wafer. Thickness of the material layer of the semi-flexible proof-mass may vary without departing from the scope. Selected areas of the proof-mass structure may be recessed below either of the horizontal (xy-plane direction) surfaces of the silicon material layer. The material of the semi-flexible proof-mass is preferably removed in areas between the primary and secondary parts, except for the coupling stiff springs, in order to allow the semi-flexible proof-mass to deform in set circumstances.

The present invention has the advantage that a solution based on deforming of a semi-flexible proof-mass is an effective and reliable way to prevent both structure breakage and stiction. A semi-flexible multi-part proof-mass structure may even be combined with various rigid or flexible stopper or bumper solutions known by a person skilled in the art.

According to a first aspect, a microelectromechanical device is provided including a substantially planar semi-flexible proof-mass comprising at least one primary part and at least one secondary part and at least one stiff spring coupling the at least one primary part and the at least one secondary part of the semi-flexible proof-mass. The device comprises at least one main spring coupled to the at least one secondary part, the main spring coupling the semi-flexible proof-mass to a suspension structure. The at least one stiff spring substantially causes the at least one primary part and said at least one secondary part to move as a single, rigid entity when the device is in a normal operation range. The at least one first stopper structure is configured to stop the at least one primary part. The semi-flexible proof-mass is configured to deform through deflection of the at least one stiff spring, when the device is subjected to a shock that impacts the device with a force that is beyond the normal operation range of the device, the shock causing a motion of the semi-flexible proof-mass at least in a direction along an axis of movement, and the at least one stiff spring further causes a restoring force causing at least one secondary part of the semi-flexible proof-mass to be driven into a restoring motion in a direction opposite to the motion along the axis of movement caused by the shock, wherein momentum of the at least one secondary part in the restoring motion further causes the primary part to dislodge from the at least one first stopper structure.

According to a second aspect, at least one of the at least one primary part of the semi-flexible proof-mass is configured to be stopped by the first stopper structure, when displacement of the semi-flexible proof-mass along the axis of movement due to the shock exceeds a first distance.

According to a third aspect, the microelectromechanical device further comprises at least two first stopper structures disposed on opposite sides of the semi-flexible proof-mass along the axis of movement. The at least two first stopper structures are configured to stop motion of the semi-flexible proof-mass caused by shocks occurring in opposite directions along the axis of movement.

According to a fourth aspect, the at least one secondary part of the semi-flexible proof-mass is configured to continue movement caused by the shock along the axis of movement after the at least one primary part has been stopped, and wherein the continued movement along the axis of movement caused by the shock causes deflection of at least one of the at least one stiff springs, thus deforming the semi-flexible proof-mass.

According to a fifth aspect, the microelectromechanical device comprises at least one second stopper structure configured to stop at least one secondary part, wherein the at least one secondary part of the semi-flexible proof-mass is configured to be stopped by the second stopper structure, when displacement of the at least one secondary part of the semi-flexible proof-mass along the axis of movement due to the shock exceeds a second distance, wherein the second distance is greater than the first distance.

According to a sixth aspect, the microelectromechanical device further comprises at least two second stopper structures disposed on opposite sides of the semi-flexible proof-mass along the axis of movement. The at least two second stopper structures are configured to stop motion of the semi-flexible proof-mass caused by shocks occurring in opposite directions along the axis of movement.

According to a seventh aspect, the semi-flexible proof-mass is configured to have more than one axes of movement, and the semi-flexible proof-mass is configured to deform in a direction of at least one of the axes of movement.

According to an eighth aspect, the semi-flexible proof-mass comprises a primary part comprising an essentially rigid, rectangular frame, placed symmetrically across a symmetry axis of the semi-flexible proof-mass, wherein the symmetry axis is aligned with the direction of the axis of movement. The semi-flexible proof-mass also comprises two secondary parts each disposed symmetrically across the symmetry axis in an enclosure within the primary part, wherein the each of the secondary parts is coupled to the primary part with two stiff springs placed symmetrically with respect to the symmetry axis of the semi-flexible proof-mass.

According to a ninth aspect, fingers of a moving comb electrode are attached to the primary part.

According to a tenth aspect, the primary part carries more than a half of the entire mass of the semi-flexible proof-mass.

According to an eleventh aspect, the semi-flexible proof-mass comprises two primary parts disposed outside the area of the secondary part and disposed symmetrically across the symmetry axis. The semi-flexible proof-mass also comprises a secondary part formed as an essentially rigid, rectangular frame disposed symmetrically across a symmetry axis of the semi-flexible proof-mass, the symmetry axis aligned with the direction of the axis of movement. Each of the two primary parts is coupled to the secondary part with two stiff springs placed in symmetrically with respect to the symmetry axis.

According to a twelfth aspect, fingers of a moving comb electrode are attached to the secondary part.

According to a thirteenth aspect, the secondary part carries more than a half of the entire mass of the semi-flexible proof-mass.

According to a fourteenth aspect, the semi-flexible proof-mass comprises two primary parts disposed essentially longitudinally in parallel positions on two sides of a symmetry axis of the semi-flexible proof-mass, the symmetry axis aligned with the direction of the axis of movement, each of the primary parts configured to be stopped in direction of the axis of movement by the first stopper structures disposed on a first distance away from both ends of each primary part. The semi-flexible proof-mass also comprises two secondary parts each placed symmetrically across the symmetry axis, each of the secondary parts configured to be stopped by a respective second stopper structure disposed on the second distance away from the side of the respective secondary part that is away from the geometrical center of the device, wherein the second distance is greater than the first distance.

According to a fifteenth aspect, fingers of a moving comb electrode are attached to the primary parts.

According to a sixteenth aspect, the secondary parts carry more than 20% of an entire mass of the semi-flexible proof-mass.

BRIEF DESCRIPTION OF THE DRAWINGS

In the following the invention will be described in greater detail, in connection with preferred embodiments, with reference to the attached drawings, in which.

DETAILED DESCRIPTION

A MEMS device may comprise a substrate layer and a functional layer suspended above the substrate layer. Fixed or stationary structures of the functional layer are suspended above the substrate layer, and movable structures of the functional layer are movably suspended above the substrate layer. Example of movable structures of a MEMS device are movable masses such as a proof-mass, springs and moving fingers electrode combs.

Figure 1:
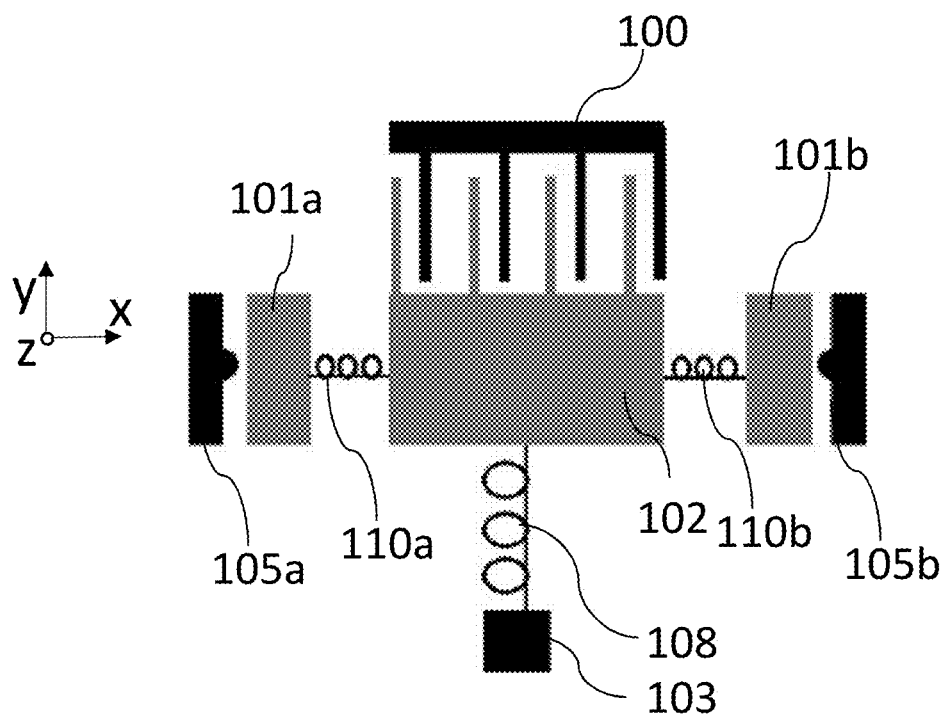
FIG. 1 is a first schematic illustration of a semi-flexible proof-mass MEMS structure having a proof-mass divided in one dimension.
Figure 2:
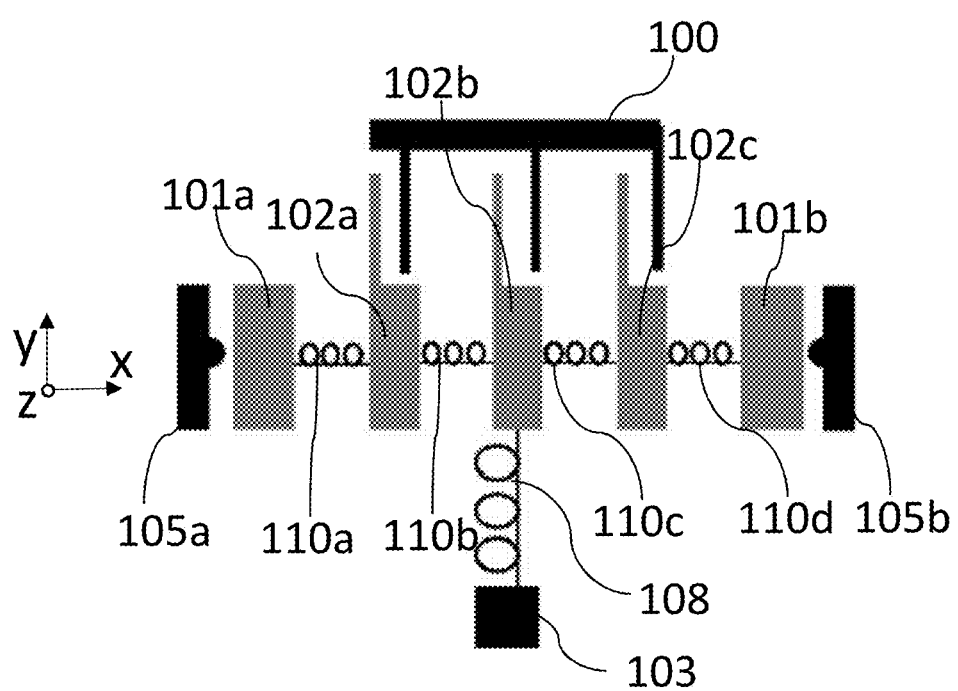
FIG. 2 is a third schematic illustration a semi-flexible proof-mass MEMS structure having a proof-mass divided in one dimension.
Figure 3:
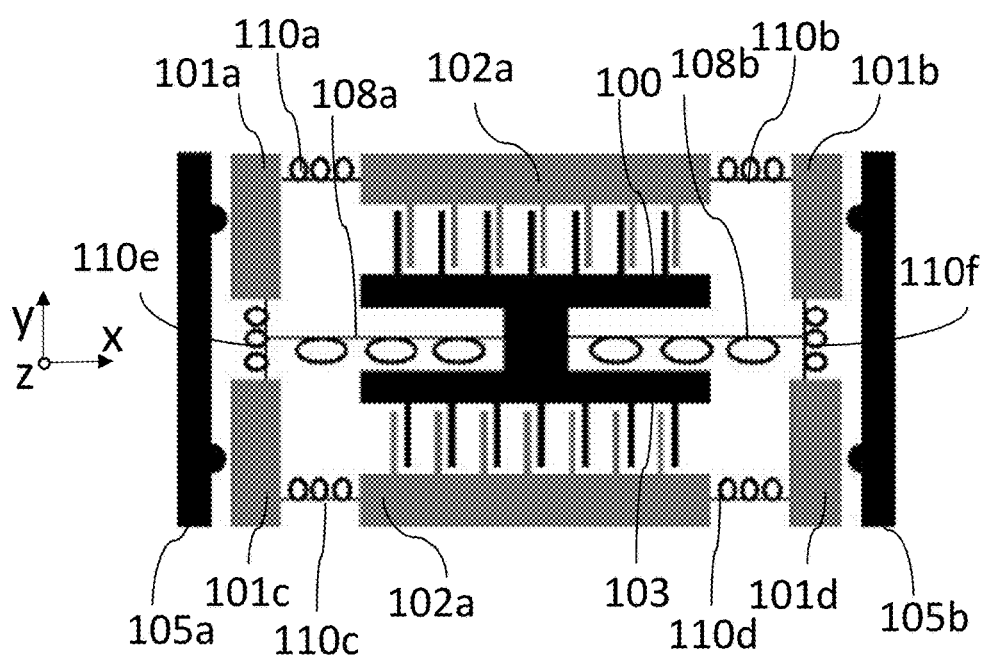
FIG. 3 is a schematic illustration of a semi-flexible proof-mass MEMS structure having a proof-mass divided in two dimensions.

A spring in a MEMS device may be considered as a suspension structure that constrains motion of the suspended structure in defined dimensions. Springs may have varying form depending on the functionality they are intended to. A rectilinear beam may act as a spring, and dimensions of the beam define the characteristics of the spring. A MEMS spring may comprise two or more rectilinear sections, forming a fold, crab leg, a U-shape or a serpentine, for example. FIGS. 1 to 3 illustrate functionality of springs in functional manner only, i.e. the physical form of the spring may be selected. Physical form of springs in a design may be selected to meet the requirements set to the specific spring. Examples of some physical forms of springs can be seen in FIGS. 4 to 10.

The term "stopper structure" may refer to any kind of stopper or bumper structures, elastic or rigid. A rigid stopper structure does not move or change its form due to impact, whereas an elastic stopper structure includes flexible parts such as springs that allow the stopper structure to deform or move, thus reducing the instantaneous forces caused when a moving structure hits the stopper structure. Various stopper structures are known in the art, and any of these may be applicable with the current invention without departing from the scope.

FIG. 1 is a schematic illustration of a first exemplary embodiment. A semi-flexible proof-mass MEMS structure includes a proof-mass structure that is divided in one dimension. Axis of movement in this exemplary structure is in x-axis direction. Axis of movement refers to a direction of a primary or secondary movement of the semi-flexible proof-mass when the device is in normal operation range. The terms normal operation, normal operation conditions and normal operation range refer to a state of operation of the device during which the semi-flexible proof-mass moves as it was a traditional rigid proof-mass without deforming. In this example, the movement occurs along the x-axis, which is aligned with the plane of the device. The structure includes a semi-flexible proof-mass (101*a*, 101*b*, 102), comprising two primary parts (101*a*, 101*b*) and a secondary part (102). Stiff springs (110*a*, 110*b*) couple the primary parts (101*a*, 101*b*) and the secondary part (102) of the proof-mass with each other. These stiff springs (110*a*, 110*b*) may be considered as part of the apparently rigid semi-flexible proof-mass in the normal operating conditions, as they move along the first (101*a*, 101*b*) and second (102) parts without significantly deflecting (i.e. flexing, bending or otherwise changing their form), thus being part of the total oscillating mass of the proof-mass. The secondary part (102) of the proof-mass is coupled to a fixed suspension structure (103) with a main spring (108). This suspension structure is preferably fixed to the substrate layer or any other fixed layer of the MEMS device so that the suspension structure (103) does not move in relation to the substrate. Such fixed suspension structures (103) are also being often called as an anchors or anchor points. The main spring (108) allows the proof-mass to move with respect to the anchor point attached to the substrate. The secondary part (102) of the proof-mass includes comb structures (comb fingers) which may be used for detecting motion of the proof-mass or for electrostatic deflection of the proof-mass. Detection with such fingers occurs by detecting change of capacitance between a moving comb electrode attached to the secondary part (102) and a fixed or stationary comb electrode attached to a stator (100). Excitation may be considered as a reverse operation, where a changing electric field between the two electrodes of the comb causes a force that is used for deflecting the proof-mass attached to the movable (rotor) part of the electrode.

In this example, the semi-flexible proof-mass (101a, 101b, 102) is made semi-flexible in particular in x-axis direction. In normal operation conditions, the whole proof-mass including the primary parts (101a, 101b), the secondary part (102) and the stiff springs (110a, 110b) moves as a single entity at least in x-axis direction. When the semi-flexible proof-mass is subject to a force or forces well beyond those present in normal operating conditions, the stiff springs (110a, 100b) may deflect (for example compress, twist or bend) depending on the construction. In following description we'll use term deflect for simplicity, but it should be understood that the actual change in the spring would depend on the form of the spring.

For describing the characteristics of the semi-flexible proof-mass when subject to a shock, let's use an example where the structure is hit by a shock that causes an impact towards the proof-mass making it move quickly towards left, i.e. the negative x-axis. When a shock in x-axis direction, or a shock having a significant component in x-axis direction, that causes an acceleration to the proof-mass that is clearly higher than the normal operating conditions, the respective first primary part (101a) hits a respective stopper structure (105a). When the first primary part (101a) having a minor share of the total mass of the proof-mass stops when hitting the stopper structure (105a), the respective first stiff spring (110a) may start to compress allowing the secondary part (102) and even the second primary part (101b) to continue moving in the direction of the shock, but the first stiff spring (110a) causes a growing restoring force against this movement: the more the first stiff spring (110a) compresses, the stronger the restoring force becomes. The impact of the shock caused towards the still moving parts (101b, 102) and towards the stopper structure (105a) is therefore reduced; instead of stopping almost instantly due to hitting a stopper structure (105a), which would be the case if the proof-mass was a traditional rigid mass, a major part of the proof-mass is now allowed to continue the motion against a growing restoring force that is proportional to the deflection of the respective first stiff spring (110a), so that the work done by the restoring force to reduce the speed of the still moving parts of the proof-mass is effectively spread over a non-zero time period. This restoring force will reduce the speed and will eventually stop the still moving parts of the semi-flexible proof-mass (101b, 102).

If the second primary part (101b) has high enough kinetic energy, the second stiff spring (110b) may also compress, causing an additional restoring force towards the second primary part (101b).

After all parts of the semi-flexible proof-mass have stopped, the stiff spring (110a) causes a force proportional to the compression of the spring according to the Hooke's law (F=−kx) towards the secondary part (102). Thus, the stiff spring (110a) causes now a restoring force, causing the major part of the semi-flexible proof-mass (101b, 102) start accelerating back towards their normal operating position. Due to this restoring force, said major part of the proof-mass gains significant momentum so that it eventually pulls along the minor primary part (101a) which is thereby released from the contact with the stopper structure (105a). Thus, the momentum of the major part (102, 101b) of the proof-mass not in contact with the stopper (105a) creates high likelihood that no sticking occurs between the primary part (101a) and the respective stopper (105a). The main spring (108) may cause a further restoring force in the same direction with the stiff spring (110a). If the second stiff spring (110b) had also deflected due to the shock, it will cause a further restoring force towards the second primary part (101b).

As the structure is essentially symmetrical in x-axis direction, similar process of stopping and recovery from impact in positive x-axis direction will naturally occur in opposite direction. In this case, the primary part (101b) hits the respective stopper structure (105b), and stiff spring (110b) causes a restoring force.

FIG. 2 is a schematic illustration of a second exemplary embodiment. A semi-flexible proof-mass MEMS structure is presented having a proof-mass divided in one dimension. Now the secondary part of the proof-mass has been divided into more than one secondary parts (102a, 102b, 102c), each part coupled to the next one by a stiff spring (110b, 110c), and stiff springs (110a, 110d) couple the primary parts (101a, 101b) and at least some of the secondary parts (102a, 102c). In this example, just the middle one of the secondary parts (102b) is coupled to the main spring (108), which is coupled to a suspension structure (103) fixed to the substrate. Alternatively, more than one parts could be coupled to a main spring, in which case there could be more than one (sub) main springs. Comparing this third exemplary embodiment with for example the first exemplary embodiment illustrated in FIG. 1, flexibly dividing the proof-mass into further parts may further distribute the negative acceleration caused by stopping the movement caused by a shock over a longer period of time. The amount of stiff springs (110a, 110b, 110c, 110d) deflecting during a specific impact and recovery process may change depending on the strength of the initial shock, spring factors of the stiff springs (110a, 110b, 110c, 110d) in direction of the impact, and the mass of each part of the proof-mass, at least.

Theoretically, there is no limit to number of parts the proof-mass can be divided, so that flexibility of the proof-mass may be increased by further dividing it into multiple parts. A suitably perforated the proof-mass may be considered as an ultimate form of a semi-flexible proof-mass, where device material between perforations acts as stiff spring structures, as long as the perforated proof-mass is stiff enough to appear as a single rigid body when the device is working in its normal operation conditions, and deformation of the proof-mass occurs only due to exceptional shock beyond the normal operation conditions.

FIG. 3 is a schematic illustration of a third exemplary embodiment with a semi-flexible proof-mass MEMS structure where the proof-mass is divided in two dimensions. Main spring (108a, 108b) is divided into two segments, attached to at least one suspension structure (103). In this specific example, the stator combs are coupled with the same suspension structure (103) as the main spring (108a, 108b).

Primary parts (101a, 101b, 101c, 101d) of the proof-mass are split now also in y-axis direction, and both pairs (101a, 101c; 101b, 101d) are connected with yet another stiff spring (110e, 110f) pairwise suspending the primary parts (101a, 101c; 101b, 101d) with each other. This kind of further division of the proof-mass enables distributing contact pressure caused by the primary parts (101a, 101b, 101c, 101d) on the stopper structures (105a, 105b) more evenly. Although not shown in this illustration, stopper structures may also be introduced in y-axis direction for stopping movement in that specific direction. The proof-mass may be made semi-flexible in y-axis direction and/or in z-axis direction in addition to x-axis direction as disclosed earlier, applying the same principle as illustrated here in x-axis direction, for recovering a linear motion caused by a shock in any direction. The same principle of semi-flexible proof-mass and first and second stopper structures may be utilized along multiple axes.

Figure 4:
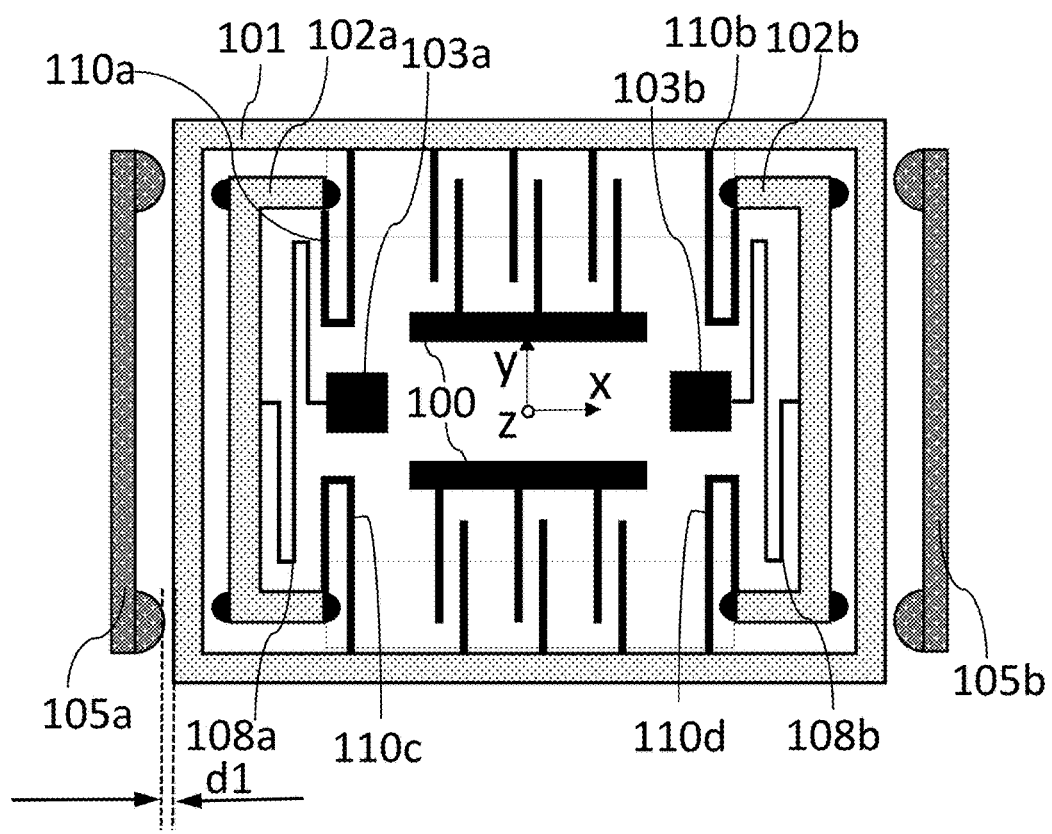
FIG. 4 is an exemplary illustration of a semi-flexible proof-mass MEMS layout with a proof-mass including a frame-like primary part.

FIG. 4 illustrates an exemplary embodiment of a semi-flexible proof-mass MEMS layout having a proof-mass including a frame-like primary part (101). This kind of arrangement has a benefit that the primary part (101) of the semi-flexible proof-mass has good torsional rigidity, which improves stability of oscillations of the semi-flexible proof-mass and reduces any unwanted torsional movements. This embodiment also illustrates an alternative, where the rotor combs are attached to the primary part (101) of the semi-flexible proof-mass. Thus, when a shock impacts the device, the combs will stop together with the primary part (101) of the proof-mass, when the movement of the primary part (101) becomes to a stop due to a stopper structure (105a, 105b) depending on the direction of movement after the shock. This way the rotor combs attached to the primary part (101) may only move a relatively small distance (d1) away from their normal operating position and the minimum distance between the static and moving comb fingers may be made small. Small deflections of the combs prevent the capacitive gaps from closing and causing short-circuit, which may produce a large and long-term error to the sensor output. In worst case closing the gaps could cause welding the silicon surfaces together and stick permanently, which effectively would disable the device permanently.

Main springs (108a, 108b) are arranged within an enclosure inside the proof-mass, coupled to at least one suspension structure (103a, 103b) inside the same enclosure. Main springs (108a, 108b) allow the proof-mass to move along the main axis of movement, but prevent the proof-mass from moving in other directions. In this example, the main springs (108a, 108b) are formed as serpentine type springs, which allow the proof-mass to move in x-axis direction, but prevent movement in other directions. Each of the main springs is coupled to one of the two secondary parts (102a, 102b) of the proof-mass. A total of four U-shaped stiff springs (110a, 110b, 110c, 110d) are shown between the primary part (101) and the secondary parts (102a, 102b) of the proof-mass, arranged symmetrically on both sides of the symmetry axis of the proof-mass. The symmetry of the combined arrangement of the stiff springs (110a, 110b, 110c, 110d) makes it capable for causing a restoring force that is well aligned with the x-axis, which is the main direction of movement of the semi-flexible proof-mass. Secondary parts (102a, 102b) of the semi-flexible proof-mass are further arranged to have bumps (black semi-circles) intended to prevent possible sticking of the secondary parts (102a, 102b) to the primary part (101) or to the stiff springs (110a, 110b, 110c, 110d). Stopper structures (105a, 105b) are arranged on opposite sides of the semi-rigid proof-mass for stopping movement caused by a shock along the axis of movement, and placed symmetrically across the axis of movement (x-axis), which is also a symmetry axis of the semi-flexible proof-mass. The placement of the two opposite stopper structures (105a, 105b) may be described as the stopper structures are located on opposite sides of the proof-mass along the axis of movement. The semi-flexible proof-mass and the stopper structures are preferably symmetric in view of a symmetry axis which is aligned with the axis of movement (x-axis).

Figure 5A:
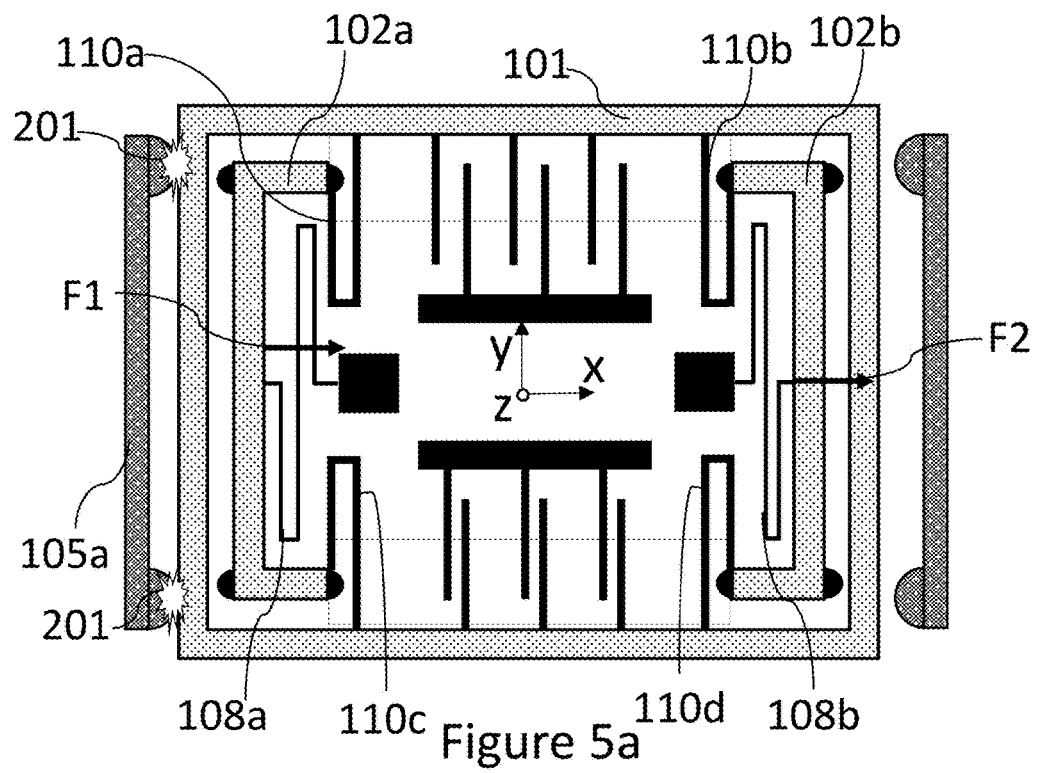
FIGS. 5*a* and 5*b* illustrate movement of a semi-flexible proof-mass with a frame-like primary part after a shock.
Figure 5B:
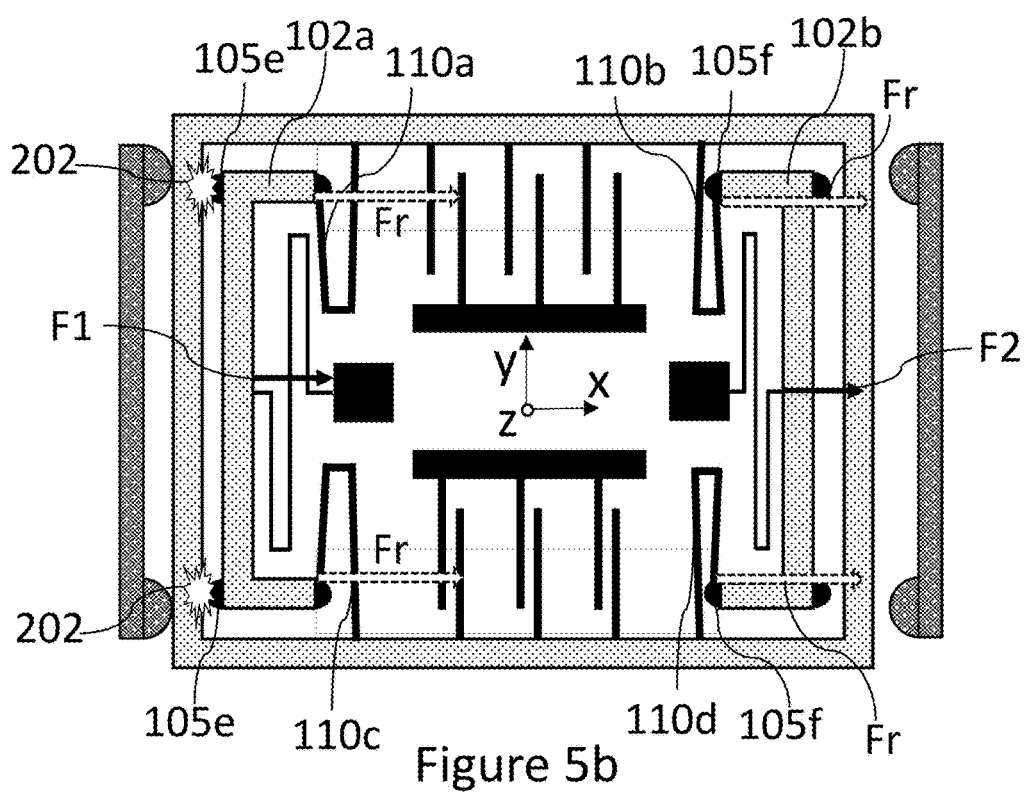

FIGS. 5a to 5b illustrate movement of the semi-flexible proof-mass with a frame-like primary part (101) after a shock. Let's have a look at consequences of a shock hitting the device, which is clearly beyond the normal operation range of the device, which causes the semi-flexible proof-mass to violently start moving towards the negative x-axis. FIG. 5a illustrates first contact, where the frame-like primary part (101) hits the stopper structure (105a). This is illustrated with the stars (201) between the primary part (101) and the stopper structure (105a). Until this contact, the semi-flexible proof-mass may be considered having moved as a single, rigid mass. The force caused by the impact of the primary part (101) hitting the stopper structure (105a) is however smaller than if a fully non-flexible proof-mass would stop at this moment, since significant part of the proof-mass, namely the secondary parts (102a, 102b) may still continue their movement in the same direction. Thus the risk of breaking of both the stopper structure (105a) and the primary part (101) is reduced. When the shock is hard enough, the secondary parts (102a, 102b) have kinetic energy remaining at the time of this stopping of the primary part. Stiff springs (110a, 110b, 110c, 110d) start now deflecting, causing a restoring force (Fr) against this movement, thus causing a negative acceleration to the secondary parts (102a, 102b), so that their speed of movement will decrease. Also the main springs (108a, 108b) cause a force (F1, F2) against this movement, but as their spring constant is lower than the spring constant of the stiff springs (110a, 110b, 110c, 110e), this force is somewhat weaker than the restoring force (Fr). If the work done by the stiff springs (110a, 110b, 110c, 110d) and the main springs (108a, 108b) against the movement of the secondary parts (102a, 102b) exceeds the remaining kinetic energy of the secondary parts (102a, 102b) when the primary part (102) stopped, the movement of the secondary parts (102a, 102b) will stop before they become into contact with any other structures. But if the shock was hard enough, at least one of the secondary parts (102a, 102b) may hit other parts of the semi-flexible proof-mass structure. In the exemplary situation in FIG. 5b, the bumps (105e) arranged to the secondary part of the leftmost secondary part (102a) becomes into contact with the primary part (101), and this secondary part (102a) will stop. The speed of the motion of the secondary part (102a) has been lowered significantly especially by the restoring force (Fr) caused by the first springs (110a, 110c), so that the impact of this contact and risk of breakage of both the primary part (101) and the secondary part (102a) due to this stopping is significantly reduced.

Additionally, the rightmost secondary part (102b) may become in contact with structural parts of the device. In this example a second set of bumps (105f) has been arranged for this purpose. In this case, this contact by the second set of bumps (105f) or some other part of the rightmost secondary part (101b) could be with the stiff springs (110b, 110d). This would only occur if the kinetic energy of the rightmost secondary part (102b) would be enough to flex the respective stiff springs (110b, 110d) enough so that the bumps (105f) would actually reach the respective stiff springs. If the original shock was not very hard, the work done by these stiff springs (105f) could be enough to cause the rightmost secondary part (102b) to stop before it comes to a contact with any other structures.

When the stiff springs (110a, 110b, 110c, 110d) flex due to an impact, they store energy from the impact. When this energy is again released, the restoring force (Fr) by the stiff springs (110a, 110b, 110c, 110d) together with the forces (F1, F2) caused by the main springs (108a, 108b) drives the secondary parts (102a, 102b) into a restoring motion opposite to the motion caused by the shock. The restoring force (Fr) together with the releasing force (F1, F2) caused by the main springs cause the secondary parts (102a, 102b) to catch momentum, which in its turn causes a releasing force towards the primary part (101) so that the primary part becomes dislodged from contact with the stopper structure (105a). Thus, the semi-flexible proof-mass not only reduces risk of breakage of the structures, but also reduces risk of sticking between the parts and structures that may have come into a contact with each other due to the shock.

Figure 6:
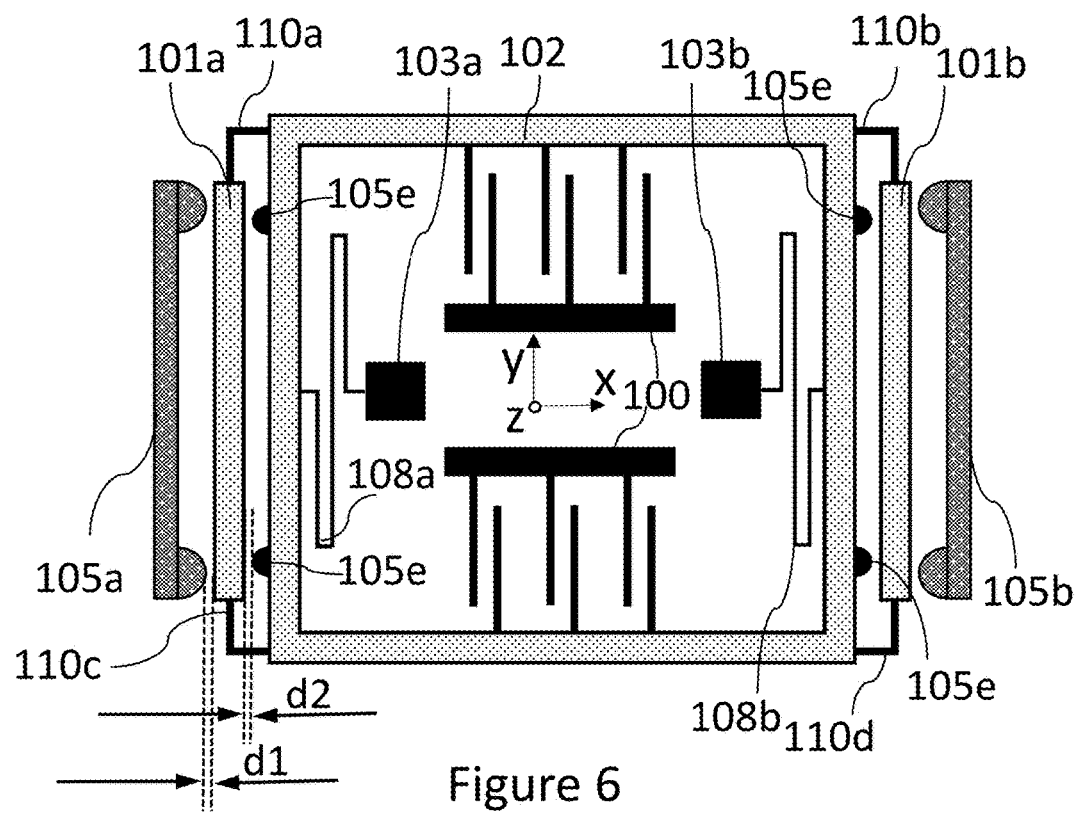
FIG. 6 is an exemplary illustration of a semi-flexible proof-mass MEMS layout with a proof-mass including a frame-like secondary part.

FIG. 6 is an exemplary embodiment illustrating a semi-flexible proof-mass MEMS layout having a proof-mass including a frame-like secondary part. Comparing this embodiment to FIG. 4, we can now notice that the primary parts (101a, 101b) are placed outside the enclosure formed by the secondary part (102). In this embodiment, the main springs (108a, 108b) suspending the proof-mass to the substrate are coupled to the secondary part (102). When subject to a shock that is beyond the normal operating conditions, one of the primary parts (101a, 101b) may hit the respective stopper structure (105a, 105b). The secondary part, now including combs of a moving (rotor) electrode, will continue movement along with the secondary part (102), which is eventually stopped by the stiff springs (110a, 110b; 110c, 110d), which also cause a restoring force (Fr) towards the secondary part (102). The stiff springs (110a, 110b; 110c, 110d) are in this example of so called crab leg type, which allows movement of the parts in the direction of the main direction of movement (x-axis). The restoring force (Fr) will then cause the secondary part (102) to start accelerating towards its initial operating position. This acceleration generates momentum to the relatively large secondary part (102), which in turn creates together with the releasing force (F1, F2) caused by the main springs (108a, 108b) a releasing force towards the primary parts (101a, 101b) which reduces risk of sticking between the primary parts (101a, 101b) and the respective stopper structures (105a, 105b). Stopper structures (105e, 105f) may be introduced to between the secondary part (102) and the primary parts (101a, 101b) to reduce risk of sticking in case the secondary part (102) and either of the primary parts (101a, 101b) would touch each other due to a shock.

Due to the shock, the rotor comb fingers attached to the secondary part (102) may move a total distance that is equal to the distance the secondary part (102) may move until becoming to a stop due to bumps (105e, 105f) arranged to the secondary part (102). It should be understood that these bumps (105e, 105f) are optional features, and we can consider these as part of the secondary part (102). The allowed total distance that the rotor comb fingers may move may be expressed as the sum of a first distance (d1) between a stopper structure (105a) and the respective primary part (101a) plus a second distance (d2) equal to the minimum distance between the primary part (101a) and the secondary part (102) when in equilibrium position. When the minimum distance between rotor comb fingers and respective stator fingers is greater than this allowed total distance, there is no risk of the rotor comb fingers to become into direct contact with the stator fingers, which could cause severe malfunction of the device, or even permanent damage thereof through comb fracture. In this exemplary layout, the distance allowed for the secondary part to move is reduced by the additional bumps (105e), which are further arranged for reducing the contact area between the first (101a) and the secondary part (102), thus reducing risk of sticking between these two. Allowing the rotor combs attached to the secondary part (102) to move a longer distance away from their normal operating position may increase risk of comb fracture, unless the distance between the stationary and movable comb fingers is greater than the total amount of movement possible for the secondary part (102) due to a shock. However, with appropriate design, this option for design is useful.

The embodiment of FIG. 6 works in very much similar way as the embodiment presented in FIG. 4 and FIGS. 5a to 5b. Now, in case of a shock, one of the primary parts (101a, 101b) would first hit a stopper structure (105a, 105b) depending on the direction of the movement caused by the shock. As springs (110a, 110b, 110c, 110c) are stiff, only the pair of stiff springs (110a, 110c; 110b, 110d) attached to the primary part (101a or 101b) hitting said stopper structure (105a, 105b) would deflect because of this first contact, and the rest of the semi-flexible proof-mass, i.e. the secondary part (102) and the other primary part (101b or 101a) will continue movement as a single mass until the secondary part (102) possibly stops due to hitting additional bumps (105e). In case the movement due to the shock would stop before the secondary part (102) hits the additional bumps (105e), the pair of the stiff springs (110a, 110c; 110b, 110d) coupling the secondary part and the other primary part (101b or 101a) would not deflect.

Figure 7A:
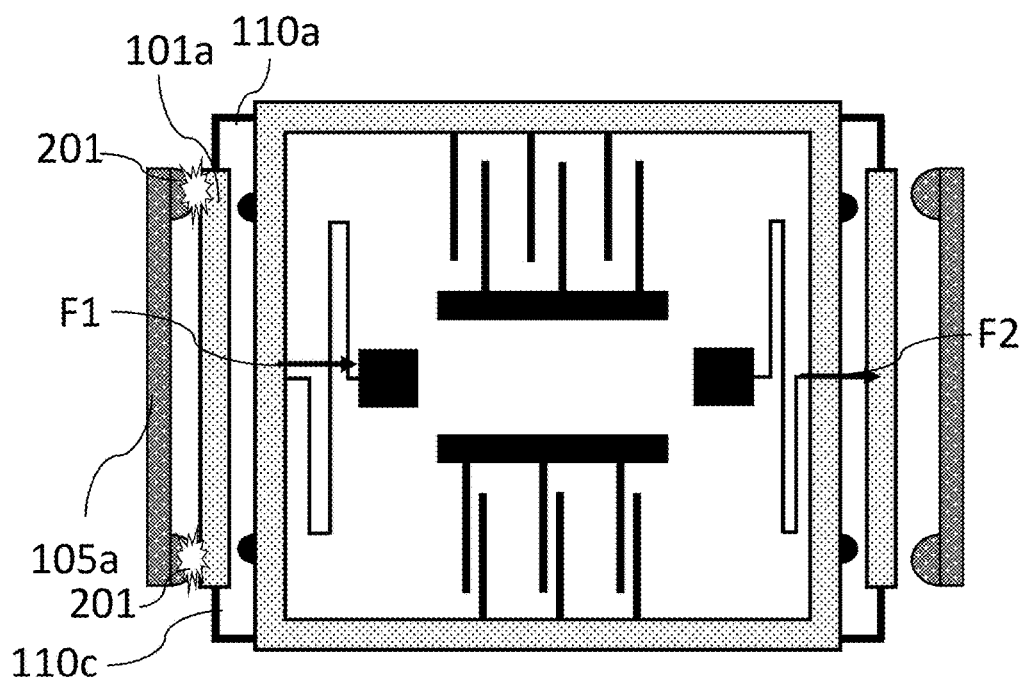
FIGS. 7*a* to 7*c* illustrate movement of a semi-flexible proof-mass with a frame-like secondary part after a shock.
Figure 7B:
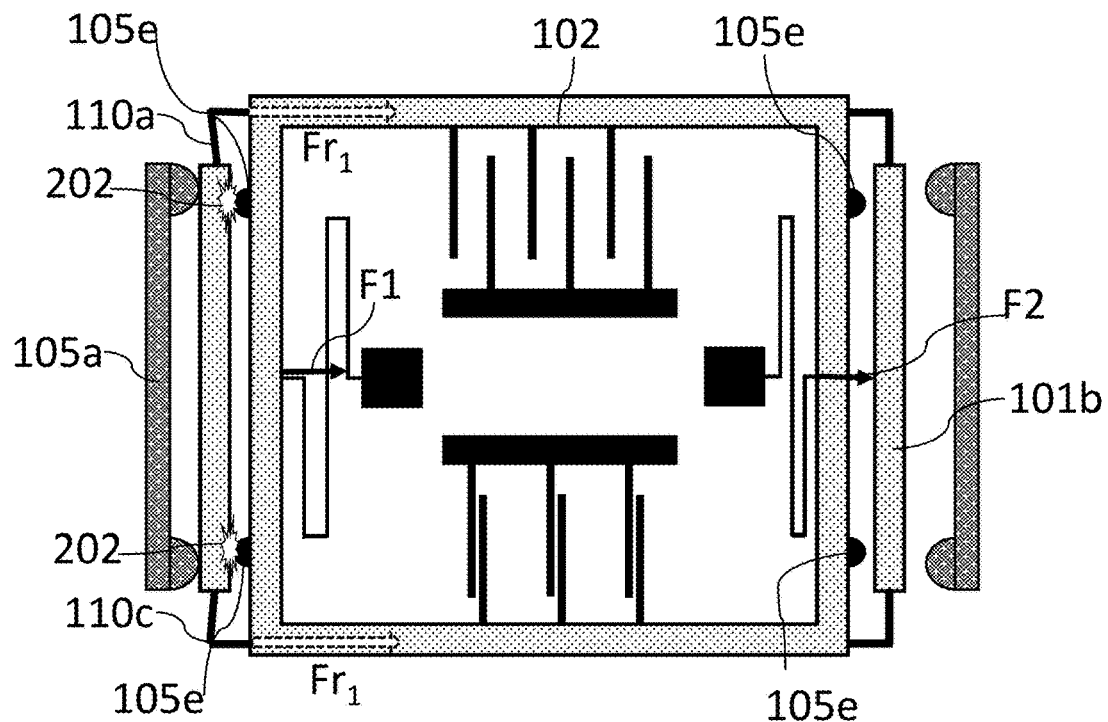
Figure 7C:
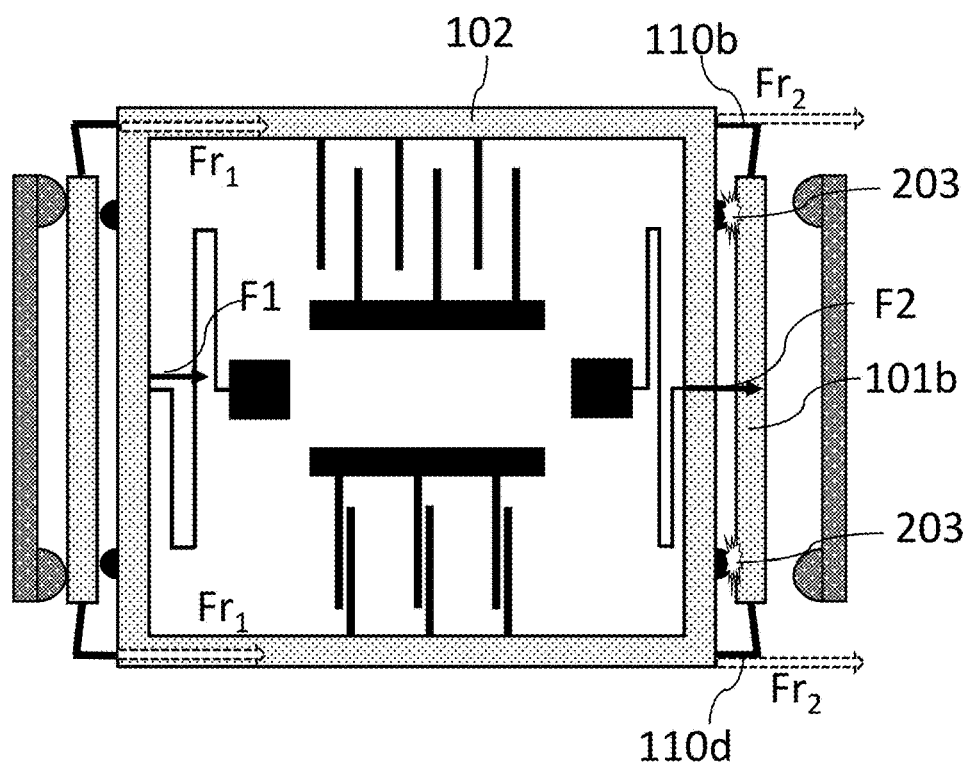

FIGS. 7a to 7c further illustrate behaviour of the structure in embodiment of FIG. 6, when subject to a shock which causes the semi-flexible proof-mass to move violently towards the negative x-axis. Only part of the references of FIG. 6 have been marked to FIGS. 7a, 7b and 7c for clarity reasons, but it should be understood that same references refer to corresponding structural parts in these figures. FIG. 7a illustrates the first contact between structures: first primary part (101a) will hit the first stopper structure (105a), which causes the first primary part (101a) to stop. This impact is illustrated with stars (201). If the rest of the proof-mass has sufficient kinetic energy exceeding the suspending capability of first stiff springs (110a, 110c), these stiff springs start to flex, allowing the rest of the semi-flexible proof-mass, including the secondary part (102) with movable (rotor) electrode fingers and the second primary part (101b) to continue movement in the same original direction. Kinetic energy of the still moving parts (102, 101b) of the semi-flexible proof-mass works against the restraining force which may also be called as a restoring force ($Fr_1$) caused by the deflecting stiff springs (110a, 110c), and the speed of motion of these parts is decreased. Also the main springs cause a growing force (F1, F2) against the movement. If all restoring forces ($Fr_1$, F1, F2) are not enough to stop the still moving parts of the proof-mass, the secondary part (102) will eventually hit the primary part and come to a stop. This is illustrated in FIG. 7b with stars (202). In this embodiment, small bumps (105e) have been arranged in the secondary part (102) on the faces against the primary parts (101a, 101b). A purpose of these small bumps (105e) is to reduce the contact area between the primary parts (101a, 101b) and the secondary part (102) thus reducing risk of stiction. It should be understood that these small bumps (105e) are optional and they may be considered as being an integral part of the secondary part (102). In case of a less severe shock, the movement of the secondary part may even come to a stop before it hits the first primary part (101a), as the restoring force ($Fr_1$) of the first stiff springs (110a, 110c) together with the force (F1, F2) caused by the main springs (108a, 108b) are enough to stop the movement and the process reverses to cause the device to be returned towards normal operation.

In case of a very hard shock, kinetic energy of the second primary part (101b) may even be high enough after the secondary part (102) has stopped, that there is still kinetic energy causing movement of the second primary part towards the same direction caused by the shock. In this case the stiff springs (110b, 110d) will deflect, and cause a restoring force ($Fr_2$) against the movement of the second primary part (101b), causing it a negative acceleration towards the second primary part (101b). The second primary part (101b) may be caused to stop due to this force ($Fr_2$), or if the force is not enough to stop the movement of the second primary part (101b), it may eventually hit the secondary part (102), illustrated by the stars (203) in FIG. 7c, which finally totally stops the movement of all parts of the semi-flexible proof-mass in this direction (negative x-axis). Again, the small bumps (105e) in the secondary part (102) on the side facing with the second primary part (101b) are arranged for reducing risk of stiction between the two as explained already earlier.

It can be now understood, that the impact by the shock to the semi-flexible proof-mass and to the stopper structures (105a, 105b) is reduced by the above illustrated arrangement, since the movement of the semi-flexible proof-mass caused by the shock does not stop instantly, but the proof-mass is brought to a stop part by part during more than one phases, and speed and thus the kinetic energy of the then moving parts of the proof-mass is reduced in between these stopping events by the restoring forces (F1, F2, $Fr_1$, $Fr_2$) caused by the springs. Thus, risk of breakage of the structure is reduced both in the proof-mass and the stopper structures (105a, 105b).

After the semi-flexible proof-mass has come to stop, a restoring motion is initiated by the forces of the stiff springs (110a, 110b, 110c, 110d) and the main springs (108a, 108b). Basically, phases of this restoring motion are reverse from what was described above. Stiff springs (110b, 110d) attached to the second primary part (101b) cause a restoring force ($Fr_2$) towards the second primary part (101b), which starts moving back towards its original operating position. The second primary part (101b) gains momentum, which pulls the secondary part (102). The secondary part (102) is also pushed to the same direction because of the restoring force ($Fr_1$) caused by stiff springs (110a, 110c), and a restoring force (F1, F2) caused by the main springs (108a, 108b) towards the secondary part (102). Thus, the secondary part (102) gains momentum. While the secondary part (102) and the second primary part (101b) now move in same direction towards the normal operating position of the proof-mass, their momentum, together with the restoring force (F1, F2) caused by the main springs (108a, 108b) causes a releasing force that pulls along the first primary part (101a) and ensures that it is released from the contact with the first stoppers (105a). It's important for the functionality that the secondary part (102) is large, i.e. more than 20% of the total mass of the proof-mass, in order to generate a sufficiently large releasing force towards the first primary part (101a).

It should be understood, that although we have described an example of behaviour due to a shock causing movement of the semi-flexible proof-mass in negative x-axis direction, the proof-mass of this example has been designed symmetrically, so that it would behave in the same manner in case of a shock causing movement towards the positive x-axis. The placement of the two opposite stopper structures (105a, 105b) may be described by saying that the stopper structures are located on opposite sides of the proof-mass along the axis of movement. The semi-flexible proof-mass and the stopper structures are preferably symmetric in view of a symmetry axis which is aligned with the axis of movement (x-axis).

Figure 8:
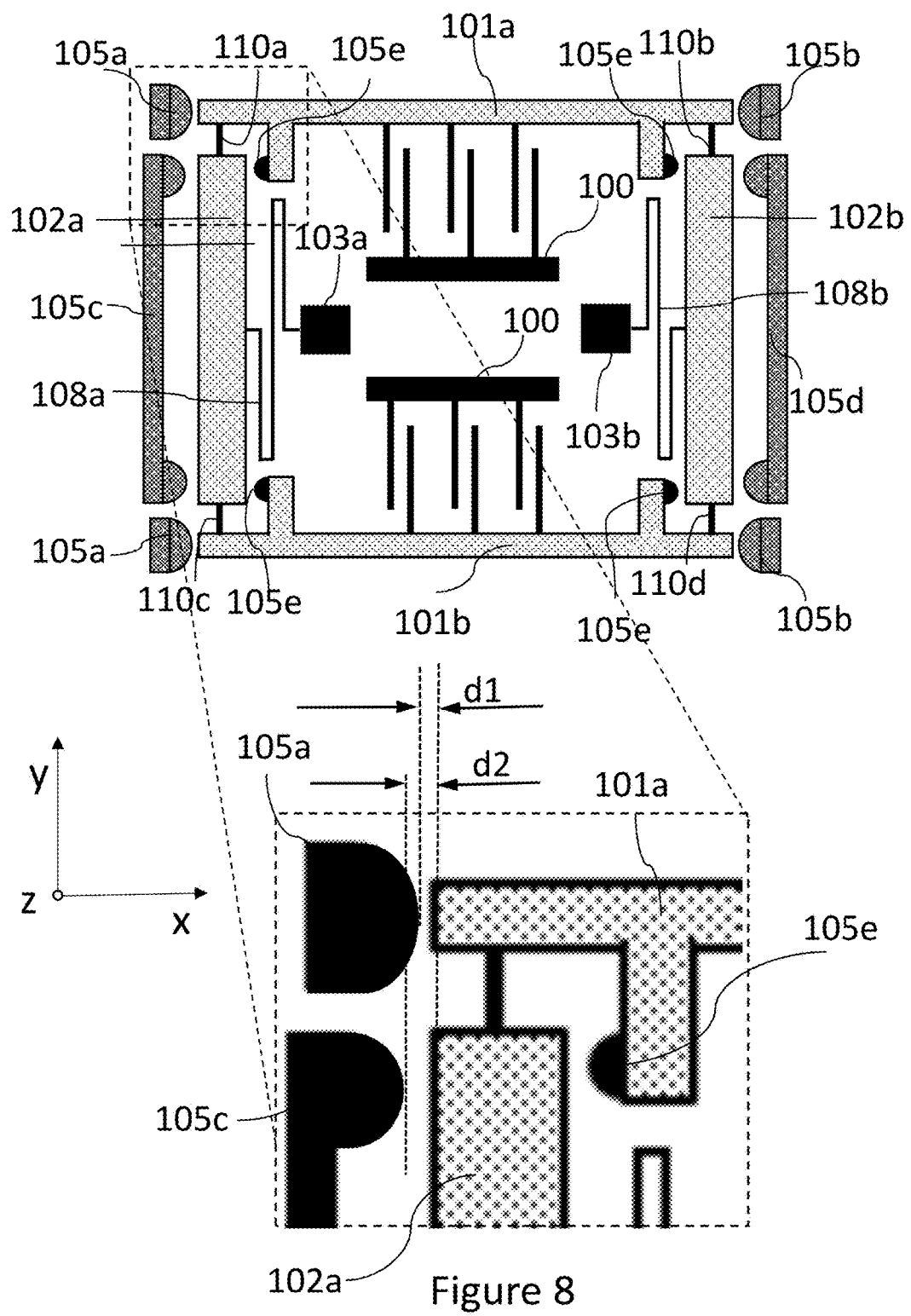
FIG. 8 is an exemplary illustration of a semi-flexible proof-mass MEMS layout having dual stopper structure.

FIG. 8 illustrates an exemplary embodiment of a semi-flexible proof-mass MEMS layout having a dual stopper structure.

Main strings (108a, 108b) suspending the semi-flexible proof-mass to the substrate are coupled to the secondary parts (102a, 102b). Both primary parts (101a, 101b) are now configured to hit stopper structures (105a, 105b) first in case of a shock in x-axis direction, and secondary parts (102a, 102b) will only hit stopper structures (105c, 105d) if the impact caused by the shock exceeds the restoring capability of the direct beam formed stiff springs (110a, 110b, 10c, 110d). In this example, primary parts (101a, 101b) are arranged in parallel positions symmetrically aligned on both sides of a symmetry axis aligned with the x-axis, whereas each of the secondary parts (102a, 102b) are placed symmetrically across this symmetry axis in perpendicular manner. Symmetry of the structure of the proof-mass with respect to the main movement axis (in this case the x-axis) facilitates linear motion in x-axis direction at all times. Moving (rotor) combs are attached to the primary parts (101a, 101b) whereas the stationary (stator) comb fingers are coupled to a stator (100), a structure which is not movable with respect to the body of the MEMS device, but fixed with the substrate. Outer edge of the primary parts (101a, 101b) is a first distance (d1) away from the respective first stopper structure (105a, 105b), and outer edge of the secondary parts (102a, 102b) is a second distance (d2) away from the respective second stopper structures (105c, 105d). First distance (d1) is shorter than the second distance (d2) so that primary parts (101a, 101b) will hit a stopper structure (105a, 105b) before the secondary parts (102a, 102b) hit a stopper structure (105c, 105d). Additional bumps (105e) have been arranged in the primary parts, but the secondary part (102a, 102b) of the proof-mass possibly hitting the second stopper structure (105c, 105d) is not configured to hit the additional bumps (105e) when moving away from the equilibrium position, except in case of a very hard shock.

Figure 9A:
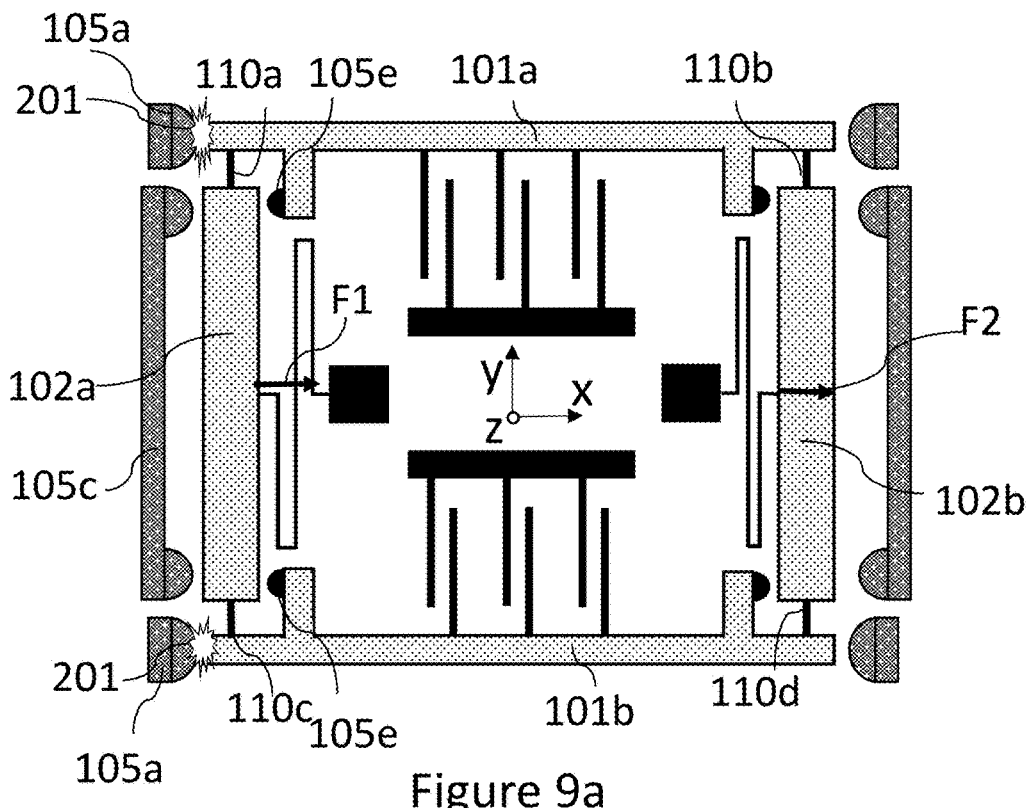
FIGS. 9*a* to 9*c* illustrate movement of a semi-flexible proof-mass having a dual stopper structure after a shock.
Figure 9B:
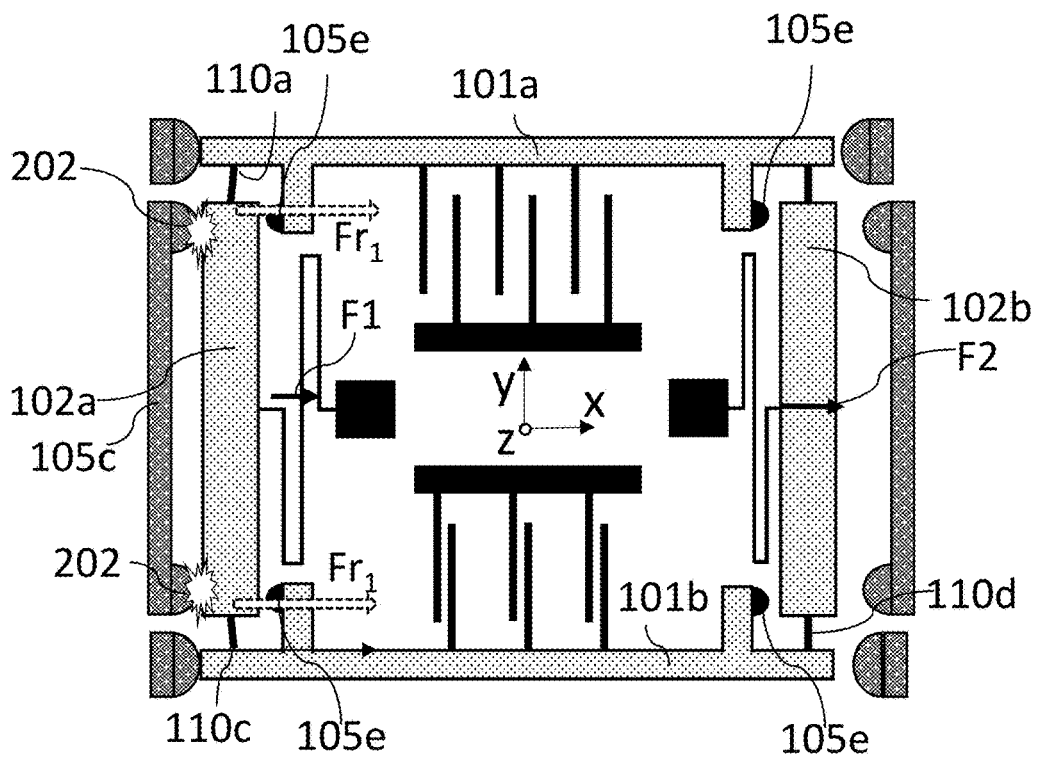
Figure 9C:
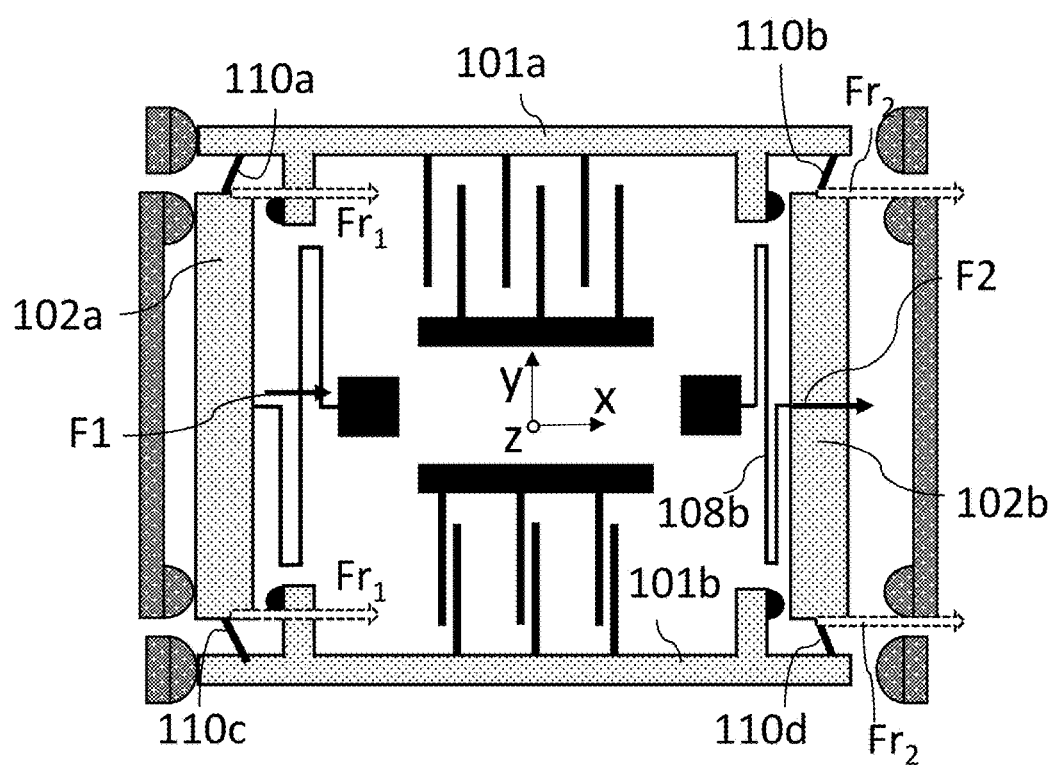

As an example, we can study an impact caused by a shock that causes the semi-flexible proof-mass in the exemplary embodiment as described in FIG. 8 to move towards negative x-axis. This is illustrated in FIGS. 9a to 9c. Again, not all references of FIG. 8 have been marked in FIGS. 9a, 9b and 9c, but it may be understood that these figures illustrate same structures, thus any references to the structural parts may be found in FIG. 8. After a shock, the whole proof-mass moves first as a single entity, until the primary parts (101a, 101b) hit the first stopper structure (105a) as illustrated with stars (201) in FIG. 9a. The form of the first stopper structure (105a) may be chosen freely. In current example, the first stopper structure (105a) comprises two stopper bumps that are configured to become to contact with the primary parts (101a, 101b) when the primary parts move a first distance from its equilibrium position in the negative x-axis direction. The entire proof-mass, including the stiff springs suspending the primary parts and the secondary parts together, has functioned as a stiff structure until this point, so that no deforming of the proof-mass has occurred. While only the primary parts (101a, 101b) of the proof-mass hit the first stopper structure (105a), the effect of this impact is relatively low when compared to a situation where the entire proof-mass would hit stopper structures and stop immediately. Thus, risk of breakage of both the proof-mass and the first stopper structure (105a) is reduced. If the acceleration caused by the shock is large enough, well beyond the normal operating conditions of the device, the stiff springs (110a, 110c) will now start deflecting, allowing the secondary part (102a) to continue moving towards the negative x-axis. Now a restoring force ($Fr_1$) is caused by the stiff springs (110a, 110c) against the movement of the still moving parts of the proof-mass, especially against the secondary part (102a) due to the spring constants thereof, causing negative acceleration on the still moving parts of the proof-mass, and the speed of the movement caused by the shock reduces due to this restoring force. If the restoring force caused by the stiff springs (110a, 110c) is strong enough compared to the impact of the shock and the remaining kinetic energy of the still moving parts of the proof-mass, the movement of the still moving parts of the proof-mass may be stopped before the secondary part (102a) reaches the second stopper structure (105c). In such case, the recovery motion from the shock starts after the proof-mass has stopped. Again, the form of the second stopper structure may be freely chosen to be appropriate for the purpose. In this example with two secondary parts (102a, 102b), one second stopper structure (105c) has two bumps configured to stop the first secondary part (102a) when the proof-mass moves in the direction of the negative x-axis, and the other second stopper structure (105d) has two bumps configured to stop the second secondary part when the proof-mass moves in the direction of the positive x-axis. The stopper structures could be fixed or flexible.

If the shock was hard, secondary part (102a) may hit the second stopper structure (105c) as illustrated with stars (202) in FIG. 9b, which hit causes secondary part (102a) to stop. Due to the primary parts (101a, 101b) earlier stopping and a share of kinetic energy of the semi-flexible proof-mass being transformed into tension of the first springs (110a, 110c), this stopping of one secondary part (102a) occurs from a significantly lower speed than the original movement of the proof-mass due to the shock, so that the effect of the impact of hitting the second stopper structure (105c) by the secondary part (102a) is relatively low. Further, only one secondary part (102a) of the proof-mass is stopped by the second stopper structure (105c), while the other secondary part (102b) is suspended to the primary parts (101a, 101b) by stiff springs (110b, 110d) and may still continue moving, if it has sufficient kinetic energy to deflect the respective stiff springs (110b, 110d). By reducing the mass and the speed of the still moving mass and the size of the portion of the still moving parts of the proof-mass that stops in this second phase, risk of breakage of the proof-mass or the second stopper structure (105c) is further lowered.

In a case of a very hard shock, the second secondary part (102b) may still have some kinetic energy after the first secondary part (102a) has been stopped by the stopper structure (105c) and if this energy exceeds the tension caused by stiff springs (110b, 110d), the second secondary part (102b) may continue moving towards the negative x-axis, but again with a significantly reduced kinetic energy and speed. This is illustrated in FIG. 9c. If the energy of the impact is large enough, the stiff springs (110b, 110d) attached to the second secondary part (102b) may in their turn deflect, causing yet further restoring force ($Fr_2$), which works against the impact of the shock. In an ultimate situation, the second secondary part (102b) may even hit the additional stopper structures (105e) arranged in the primary parts (101a, 101b) on the side facing towards the second secondary part (102b).

Over all, the impact caused by the shock may be divided this way to a chain of events each carrying part of the impact and sharing the stress caused by the shock: partial stopping of a number of parts of the proof-mass and restoring forces reducing the speed of the primary and secondary parts (101a, 101b, 102a, 102b) of the proof-mass caused by the stiff springs (110a, 110c; 110b, 110d). Also the main springs (108a, 108b) cause a restoring force, but while the main springs (108a, 108b) intended to be flexible in the direction of the movement (along the axis of motion), this force is clearly smaller than the restoring force caused by the stiff springs (110a, 110c; 110b, 110d).

The restoring forces ($Fr_1$, $Fr_2$) caused by the stiff springs (110a, 110c; 110b, 110d) and the forces (F1, F2) caused by the main springs will cause the proof-mass to start returning towards its initial position. We may simplify this by describing the restoring motion as opposite to the phases of motion caused by the shock.

In case of a hard shock that was only strong enough to cause deflecting of stiff springs (110a, 110c) coupled to the first secondary part (102a), the first secondary part (102a) will start moving in a restoring motion, due to the restoring force ($Fr_1$) caused by the stiff springs (110a, 110c) in positive x-axis direction. A further releasing force F1 is caused by the main spring (108a), pulling the first secondary part (102a) away from the second stopper (105c). While the first secondary part (102a) carries a significant portion of the total mass of the semi-flexible proof-mass, momentum of this relatively large moving part will cause together with releasing force (F1) of the main springs (108a, 108b) a releasing force to the primary parts (101a, 101b) of the proof-mass, so that the proof-mass becomes effectively pulled away from contact with the first stoppers (105a). Thus, risk of sticking is reduced.

In case of a recovery from a very hard shock, strong enough to deflect even the stiff springs (110b, 110d) attached to the second secondary part (102b), these stiff springs (110b, 110d) provide additional restoring force ($Fr_2$), and cause restoring momentum for the second secondary part (102b), which may thus cause additional releasing force towards the rest of the proof-mass, especially towards primary parts (101a, 101b). Due to the restoring forces ($Fr_1$, $Fr_2$) caused by the stiff springs (110a, 110b, 110c, 110d) and the momentum of the moving parts of the proof-mass caused by the restoring forces ($Fr_1$, $Fr_2$), the entire semi-flexible proof-mass is effectively brought back to it's initial, normal operating position, where it appears as a single, non-flexible structure. In addition to the restoring forces ($Fr_1$, $Fr_2$) caused by the stiff springs (110a, 110b, 110c, 110d), the main springs (108a, 108b) cause a releasing force that facilitates restoring of the normal operating position. However, as the main springs are relatively loose, the releasing force caused by them is significantly weaker than the restoring force produced by the stiff springs (110a, 110b, 110c, 110d).

It should be understood, that the structure described above would work in similar manner if it was subject to a shock causing the proof-mass to move towards the positive x-axis. Then the functionality would be a mirror image of what was described above. The placement of the two opposite stopper structures each comprising first and second stoppers (105a, 105c; 105b, 105d) may be described by saying that the stopper structures are located on opposite sides of the proof-mass along the axis of movement. The semi-flexible proof-mass and the stopper structures are preferably symmetric in view of a symmetry axis which is aligned with the axis of movement (x-axis).

Figure 10:
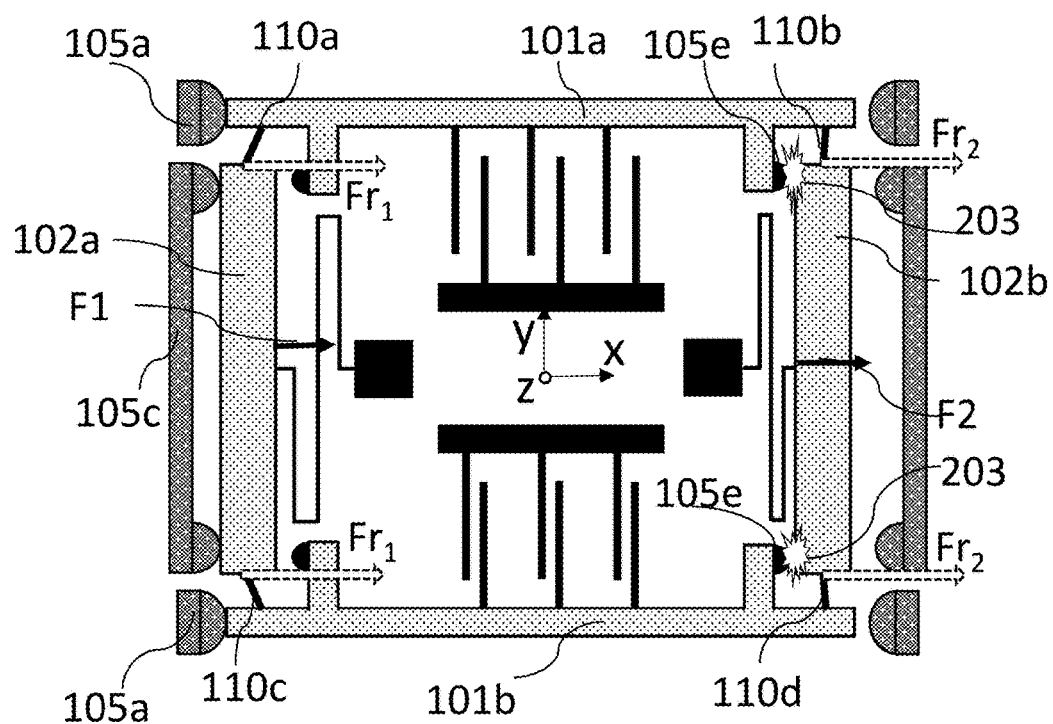
FIG. 10 illustrates movement of a semi-flexible proof-mass after a very hard shock.

Let's further consider a case where a very hard shock impacts the device of FIG. 8 that causes the proof-mass to move towards the negative x-axis. This is illustrated in FIG. 10. If both the primary parts (101a, 101b) and a first secondary part (102a) have hit stopper structures and thus stopped in their turn, and the second secondary part (102b) of the proof-mass still has kinetic energy in direction of the shock, the second secondary part (102b) may further move towards the negative x-axis, causing a further restoring force ($Fr_2$) to be induced in the stiff springs (110b, 110d) attached to the second secondary part (102b). As illustrated in FIG. 10, if the restoring force ($Fr_2$) caused by these stiff springs (110b, 110d) would not be sufficient, the second secondary part could hit the additional bumps (105e) arranged in the structure of the primary parts (101a, 101b), which would finally cause the shock initiated movement towards negative x-axis to stop. Again, the impact caused by this stopping is significantly reduced due to damping caused by the earlier phased stops of the primary parts (101a, 101b) and the first secondary part (102a), caused by the first and second stopper structures (105a, 105b, 105c, 105d) and by the energy temporarily stored into stiff springs (110a, 110b, 110c, 110d), so that risk of breakage of the additional stopper structures and parts of the semi-flexible proof-mass is reduced.

Restoring movement of this second embodiment is caused initially by the restoring force caused by the stiff springs (110a, 110b, 110c, 110d). Momentum of the secondary parts (102a, 102b) in restoring motion and releasing force (F1, F2) by the main springs (108a, 108b) facilitate dislodging of primary parts (101a, 101b) from contact with the first stopper structures (105a), thus enabling the device to return to normal operating position in a reliable and effective manner.

In the embodiment of a semi-flexible proof-mass MEMS layout having a dual stopper structure, we can notice that the moving (rotor) comb electrode structures have been attached to the primary parts (101a, 101b). Thus, the moving comb fingers will move because of a shock only until the primary parts (101a, 101b) become to a stop. Because of this feature, the first stopper structures (105a, 105b) may be called as the "comb stoppers" in this embodiment. It's beneficial to minimize the movement of the combs by attaching the moving comb fingers to the primary parts (101a, 101b), as this reduces risk of short circuit of the electrodes as described earlier.

It should be understood, that the structure described above would work in similar manner if it was subject to a shock causing the proof-mass to move towards the positive x-axis. Then the functionality would be a mirror image of what was described above. The placement of the two opposite stopper structures each comprising first and second stoppers (105a, 105c; 105b, 105d) may be described as the stopper structures are located on opposite sides of the proof-mass along the axis of movement. The semi-flexible proof-mass and the stopper structures are preferably symmetric in view of a symmetry axis which is aligned with the axis of movement (x-axis).

Although above examples mainly illustrate the principle in x-axis direction, it should be understood that the same inventive principle may be applied to a movement along an axis of movement in any direction. By designing the proof-mass semi-flexible along more than one axis and including a set of first and second stopper structures on opposite sides of said proof-mass along the respective more than one axes, shock tolerance and recovery of the device may be improved along more than one axes. These more than one axes may, but do not have to be mutually orthogonal. Presented arrangement is especially useful for a proof-mass configured for linear movement along at least one axis of movement. Linear movement of the proof-mass may occur for example within the plane of the device, such as along the x- or y-axes of the previous embodiments, or even out of plane of the device, along the z-axis in the presented embodiments. Further, the proof-mass may be configured to be semi-flexible in direction of just one selected axis of movement, although the semi-flexible proof-mass was intended for motions along or about multiple different axes.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A microelectromechanical device, comprising:
a substantially planar semi-flexible proof-mass comprising at least one primary part and at least one secondary part, and at least one stiff spring coupling the at least one primary part to the at least one secondary part of the semi-flexible proof-mass, the at least one stiff spring substantially causing the at least one primary part and the at least one secondary part to move as a single, rigid entity when the device is in a normal operation range;
at least one main spring coupled to the at least one secondary part, the main spring coupling the semi-flexible proof-mass to a fixed suspension structure; and
at least one first stopper structure configured to stop the at least one primary part,
wherein the semi-flexible proof-mass is configured to deform through deflection of the at least one stiff spring, when the device is subjected to a shock that impacts the device with a force that is beyond the normal operation range of the device, the shock causing a motion of the semi-flexible proof-mass at least in a direction along an axis of movement, and
wherein the at least one stiff spring further causes a restoring force causing the at least one secondary part of the semi-flexible proof-mass to be driven into a restoring motion in a direction opposite to the motion along the axis of movement caused by the shock, wherein momentum of the at least one secondary part in the restoring motion further causes the at least one primary part to dislodge from the at least one first stopper structure.

2. The microelectromechanical device according to claim 1, wherein
at least one of the at least one primary part of the semi-flexible proof-mass is configured to be stopped by the first stopper structure, when displacement of the semi-flexible proof-mass along the axis of movement due to the shock exceeds a first distance.

3. The microelectromechanical device according to claim 1, further comprising:
at least two first stopper structures disposed on opposite sides of the semi-flexible proof-mass along the axis of movement, wherein the at least two first stopper structures are configured to stop motion of the semi-flexible proof-mass caused by shocks occurring in opposite directions along the axis of movement.

4. The microelectromechanical device according to claim 1, where the at least one secondary part of the semi-flexible proof-mass is configured to continue movement caused by the shock along the axis of movement after the at least one primary part has been stopped, and wherein the continued movement along the axis of movement caused by the shock causes deflection of at least one of the stiff springs, thus deforming the semi-flexible proof-mass.

5. The microelectromechanical device according to claim 1, further comprising:
at least one second stopper structure configured to stop the at least one secondary part,
wherein the at least one secondary part of the semi-flexible proof-mass is configured to be stopped by the second stopper structure, when displacement of the secondary part of the semi-flexible proof-mass along the axis of movement due to the shock exceeds a second distance, wherein the second distance is greater than the first distance.

6. The microelectromechanical device according to claim 5, further comprising:
at least two second stopper structures disposed on opposite sides of the semi-flexible proof-mass along the axis of movement, wherein the at least two second stopper structures are configured to stop motion of the semi-flexible proof-mass caused by shocks occurring in opposite directions along the axis of movement.

7. The microelectromechanical device according to claim 1, wherein the semi-flexible proof-mass is configured to have more than one axes of movement, and the semi-flexible proof-mass is configured to deform in a direction of at least one of the axes of movement.

8. The microelectromechanical device according to claim 1, wherein the semi-flexible proof-mass comprises:
a primary part comprising an essentially rigid, rectangular frame, disposed symmetrically across a symmetry axis of the semi-flexible proof-mass, wherein the symmetry axis is aligned with the direction of the axis of movement; and
two secondary parts each disposed symmetrically across the symmetry axis in an enclosure within the primary part,
wherein each of the secondary parts is coupled to the primary part with two stiff springs placed symmetrically with respect to the symmetry axis of the semi-flexible proof-mass.

9. The microelectromechanical device according to claim 8, wherein fingers of a moving comb electrode are attached to the primary part.

10. The microelectromechanical device according to claim 8, wherein
the primary part carries more than a half of the entire mass of the semi-flexible proof-mass.

11. The microelectromechanical device according to claim 1, wherein the semi-flexible proof-mass comprises:
a secondary part formed as an essentially rigid, rectangular frame disposed symmetrically across a symmetry axis of the semi-flexible proof-mass, the symmetry axis aligned with the direction of the axis of movement,
two primary parts disposed outside the area of the secondary part and disposed symmetrically across the symmetry axis,
wherein each of the two primary parts is coupled to the secondary part with two stiff springs placed in symmetrically with respect to the symmetry axis.

12. The microelectromechanical device according to claim 11, wherein fingers of a moving comb electrode are attached to the secondary part.

13. The microelectromechanical device according to claim 11, wherein
the secondary part carries more than a half of the entire mass of the semi-flexible proof-mass.

14. The microelectromechanical device according to claim 1, wherein the semi-flexible proof-mass comprises:
two primary parts disposed essentially longitudinally in parallel positions on two sides of a symmetry axis of the semi-flexible proof-mass, the symmetry axis aligned with the direction of the axis of movement, each of the primary parts configured to be stopped in direction of the axis of movement by the first stopper structures placed on a first distance away from both ends of each primary part; and
two secondary parts each disposed symmetrically across the symmetry axis, each of the secondary parts configured to be stopped by a respective second stopper structure placed on the second distance away from the side of the respective secondary part that is away from the geometrical center of the device,
wherein the second distance is greater than the first distance.

15. The microelectromechanical device according to claim 14, wherein fingers of a moving comb electrode are attached to the primary parts.

16. The microelectromechanical device according to claim 14, wherein
the secondary parts carry more than 20% of an entire mass of the semi-flexible proof-mass.

* * * * *